(12) United States Patent
Kim et al.

(10) Patent No.: US 12,453,273 B2
(45) Date of Patent: Oct. 21, 2025

(54) DISPLAY DEVICE

(71) Applicant: Samsung Display Co., Ltd., Yongin-si (KR)

(72) Inventors: Young Do Kim, Yongin-si (KR); Seohyeon Choi, Yongin-si (KR); Muhyun Kim, Yongin-si (KR); Hansun Ryou, Yongin-si (KR); Jungmin Choi, Yongin-si (KR); Jongbeom Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 314 days.

(21) Appl. No.: 18/113,277

(22) Filed: Feb. 23, 2023

(65) Prior Publication Data

US 2023/0345804 A1 Oct. 26, 2023

(30) Foreign Application Priority Data

Apr. 26, 2022 (KR) .......................... 10-2022-0051619

(51) Int. Cl.
*H10K 59/80* (2023.01)
*G06F 3/041* (2006.01)
*H10K 59/122* (2023.01)
*H10K 59/40* (2023.01)
*H10K 102/00* (2023.01)

(52) U.S. Cl.
CPC ......... *H10K 59/879* (2023.02); *G06F 3/0412* (2013.01); *H10K 59/122* (2023.02); *H10K 59/40* (2023.02); *H10K 2102/311* (2023.02)

(58) Field of Classification Search
CPC .... H10K 59/879; H10K 59/122; H10K 59/40; H10K 2102/311; H10K 2102/351; H10K 59/8722; H10K 59/50; H10K 50/858; G06F 3/0412; G06F 2203/04102; G06F 2203/04103; G06F 2203/04112; G06F 3/0446
See application file for complete search history.

(56) References Cited

U.S. PATENT DOCUMENTS 9,774,005 B2 9/2017 Abe et al.
2008/0013177 A1 1/2008 Hatano et al.
(Continued)

FOREIGN PATENT DOCUMENTS

KR 1020070028407 A 3/2007
KR 102205622 B1 1/2021

*Primary Examiner* — Nilufa Rahim
(74) *Attorney, Agent, or Firm* — CANTOR COLBURN LLP

(57) ABSTRACT

A display device includes a display panel including light emitting regions, in which light emitting elements are respectively disposed, and a non-light emitting region adjacent to the light emitting regions and a light control layer including an organic pattern in which pattern openings, which overlap the non-light emitting region and respectively correspond to the light emitting regions, are defined, a first adhesive layer which covers the organic pattern and has a lower refractive index than the organic pattern, a second adhesive layer which is disposed on the first adhesive layer and has a higher refractive index than the first adhesive layer, and a third adhesive layer which is disposed on the second adhesive layer and has a lower refractive index than the second adhesive layer.

20 Claims, 9 Drawing Sheets

(56) References Cited

U.S. PATENT DOCUMENTS

| | | | |
|---|---|---|---|
| 2009/0079336 A1* | 3/2009 | Yamada | H10K 59/876 |
| | | | 313/504 |
| 2017/0069808 A1* | 3/2017 | Kim | H10K 50/858 |
| 2018/0134922 A1* | 5/2018 | Katami | C09J 11/08 |
| 2019/0103576 A1* | 4/2019 | Okada | H05B 33/04 |
| 2020/0364436 A1* | 11/2020 | Beon | G06V 10/143 |
| 2020/0388789 A1* | 12/2020 | Cha | H10K 59/879 |
| 2021/0384476 A1* | 12/2021 | Sim | H10K 59/871 |
| 2022/0037601 A1* | 2/2022 | Lee | H10K 59/8722 |
| 2023/0083180 A1* | 3/2023 | Miyashita | G09F 9/30 |
| | | | 359/601 |
| 2024/0032398 A1* | 1/2024 | Sun | H10K 59/879 |
| 2024/0357907 A1* | 10/2024 | Wang | H10K 59/879 |

\* cited by examiner

DISPLAY DEVICE

This application claims priority to Korean Patent Application No. 10-2022-0051619, filed on Apr. 26, 2022, and all the benefits accruing therefrom under 35 U.S.C. § 119, the content of which in its entirety is herein incorporated by reference.

BACKGROUND

1. Field

The disclosure herein relates to a display apparatus, and more specifically, to a display device including adhesive layers having different refractive indices from each other and including a light control layer that changes a light path.

2. Description of the Related Art

Electronic devices such as a smart phone, a tablet, a laptop computer, a vehicle navigation, and a smart television are being widely used in various fields. These electronic devices typically include a display device for providing information. Such a display device may be desired to have a predetermined impact resistance and increased light output efficiency.

SUMMARY

Embodiments of the disclosure provide a display device maintaining a predetermined impact resistance. Embodiments of the disclosure also provides a display device having improved light output efficiency.

An embodiment of the invention provides a display device including: a display panel including light emitting regions, in which light emitting elements are respectively disposed, and a non-light emitting region adjacent to the light emitting regions; and a light control layer including an organic pattern in which pattern openings, which overlap the non-light emitting region and respectively correspond to the light emitting regions, are defined, a first adhesive layer which covers the organic pattern and has a lower refractive index than the organic pattern, a second adhesive layer which is disposed on the first adhesive layer and has a higher refractive index than the first adhesive layer, and a third adhesive layer which is disposed on the second adhesive layer and has a lower refractive index than the second adhesive layer.

In an embodiment, an inner side surface of the organic pattern defining each of the pattern openings may be inclined.

In an embodiment, an angle between a bottom surface of the organic pattern and the inner side surface of the organic pattern may be in a range of about 45° to about 80°.

In an embodiment, the organic pattern may have a thickness in a range of about 2.0 micrometers ($\mu$m) to about 3.5 $\mu$m.

In an embodiment, each of the first adhesive layer and the third adhesive layer may have a refractive index in a range of about 1.45 to about 1.48.

In an embodiment, the first adhesive layer may have a thickness in a range of about 1 $\mu$m to about 5 $\mu$m.

In an embodiment, the second adhesive layer may have a refractive index in a range of about 1.55 to about 1.70.

In an embodiment, the second adhesive layer may include a base layer including an acrylic-based monomer and a high refraction material, and the high refraction material may include at least one selected from zirconium oxide, titanium oxide, and zinc oxide.

In an embodiment, the second adhesive layer may have a maximum thickness in a range of about 3 $\mu$m to about 25 $\mu$m.

In an embodiment, the third adhesive layer may have a thickness in a range of about 25 $\mu$m to about 200 $\mu$m.

In an embodiment, the display panel and the light control layer may be foldable with respect to a folding axis extending in one direction.

In an embodiment, the display device may further include a sensor disposed between the display panel and the light control layer, wherein the sensor may include at least one insulation layer and sensing electrodes insulated from each other.

In an embodiment, the at least one insulation layer may include a first sensing insulation layer disposed on the display panel and a second sensing insulation layer disposed on the first sensing insulation layer, and the organic pattern may be disposed on the second sensing insulation layer.

In an embodiment, the sensing electrodes may include a first conductive pattern disposed on the first sensing insulation layer and a second conductive pattern disposed on the second sensing insulation layer, and the second conductive pattern may include mesh lines overlapping the non-light emitting region.

In an embodiment, at least a portion of the mesh lines may be in contact with the organic pattern.

In an embodiment, each of the first adhesive layer, the second adhesive layer, and the third adhesive layer may have a modulus in a range of about 20 kilopascals (Kpa) to about 100 Kpa.

In an embodiment of the invention, a display device includes: a display panel including light emitting regions, a non-light emitting region adjacent to the light emitting regions, and pixels which provide light to the corresponding light emitting regions among the light emitting regions; and a light control layer including organic patterns respectively corresponding to the light emitting region, a first adhesive layer which covers the organic patterns and has a higher refractive index than the organic patterns, a second adhesive layer which is disposed on the first adhesive layer and has a lower refractive index than the first adhesive layer, and a third adhesive layer which is disposed on the second adhesive layer and has a higher refractive index than the second adhesive layer.

In an embodiment, an angle between a bottom surface of the organic patterns and an inner side surface of the organic patterns may be in a range of about 45° to about 80°.

In an embodiment, each of the organic patterns may have a thickness in a range of about 2.0 $\mu$m to about 3.5 $\mu$m.

In an embodiment, the first adhesive layer may have a thickness in a range of about 1 $\mu$m to about 5 $\mu$m, the second adhesive layer may have a maximum thickness in a range of about 3 $\mu$m to about 25 $\mu$m, and the third adhesive layer may have a thickness in a range of about 25 $\mu$m to about 200 $\mu$m.

BRIEF DESCRIPTION OF THE DRAWINGS

The accompanying drawings are included to provide a further understanding of embodiments of the invention, and are incorporated in and constitute a part of this specification. The drawings illustrate embodiments of the invention and, together with the description, serve to explain principles of the invention. In the drawings.

DETAILED DESCRIPTION

Figure 1:
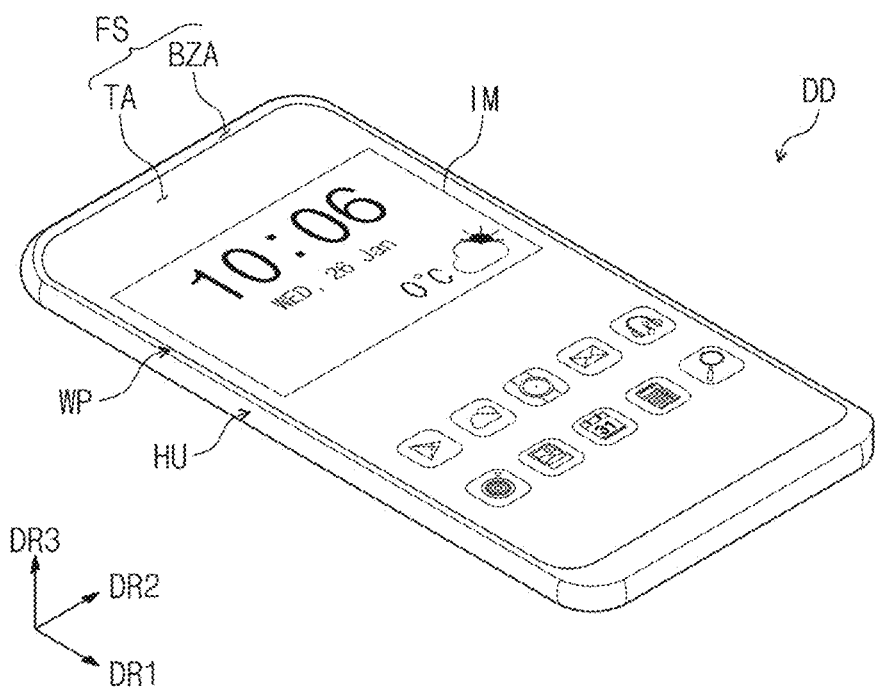
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals refer to like components throughout. Also, in the drawings, the thicknesses, ratios, and dimensions of the components are exaggerated for effective description of technical contents.

It will be understood that, although the terms "first," "second," etc. may be used herein to describe various components, these components should not be limited by these terms. These terms are only used to distinguish one component from another. For example, a first component could be termed a second component, and, similarly, a second component could be termed a first component, without departing from the scope of embodiments of the invention.

In addition, terms such as "below," "under," "on," and "above" may be used to describe the relationship between components illustrated in the figures. The terms are used as a relative concept and are described with reference to the direction indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. In addition, it will be understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
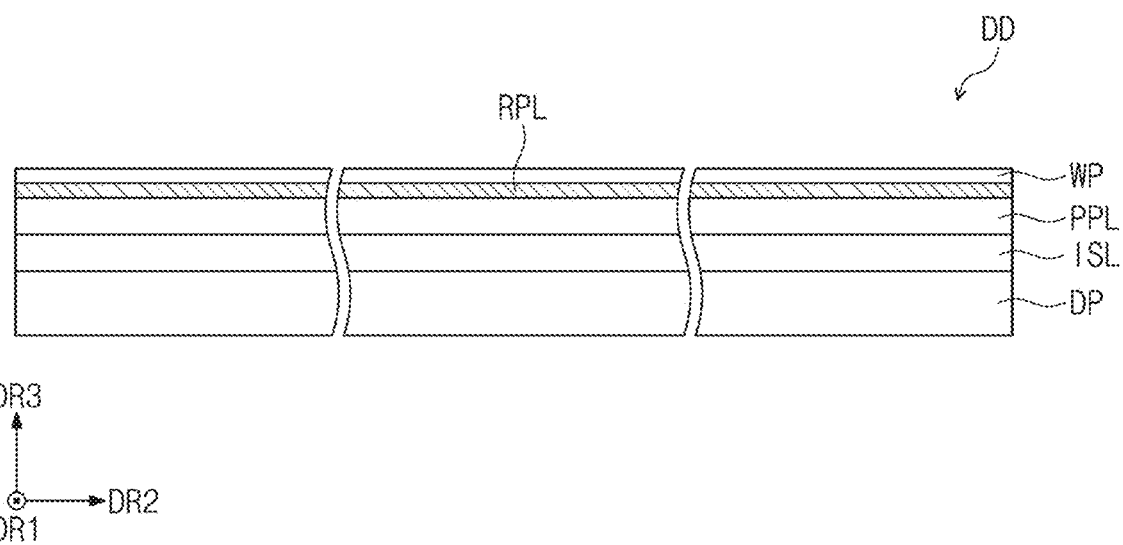
FIG. 2 is a cross-sectional view of a display device according to an embodiment of the invention.
Figure 3:
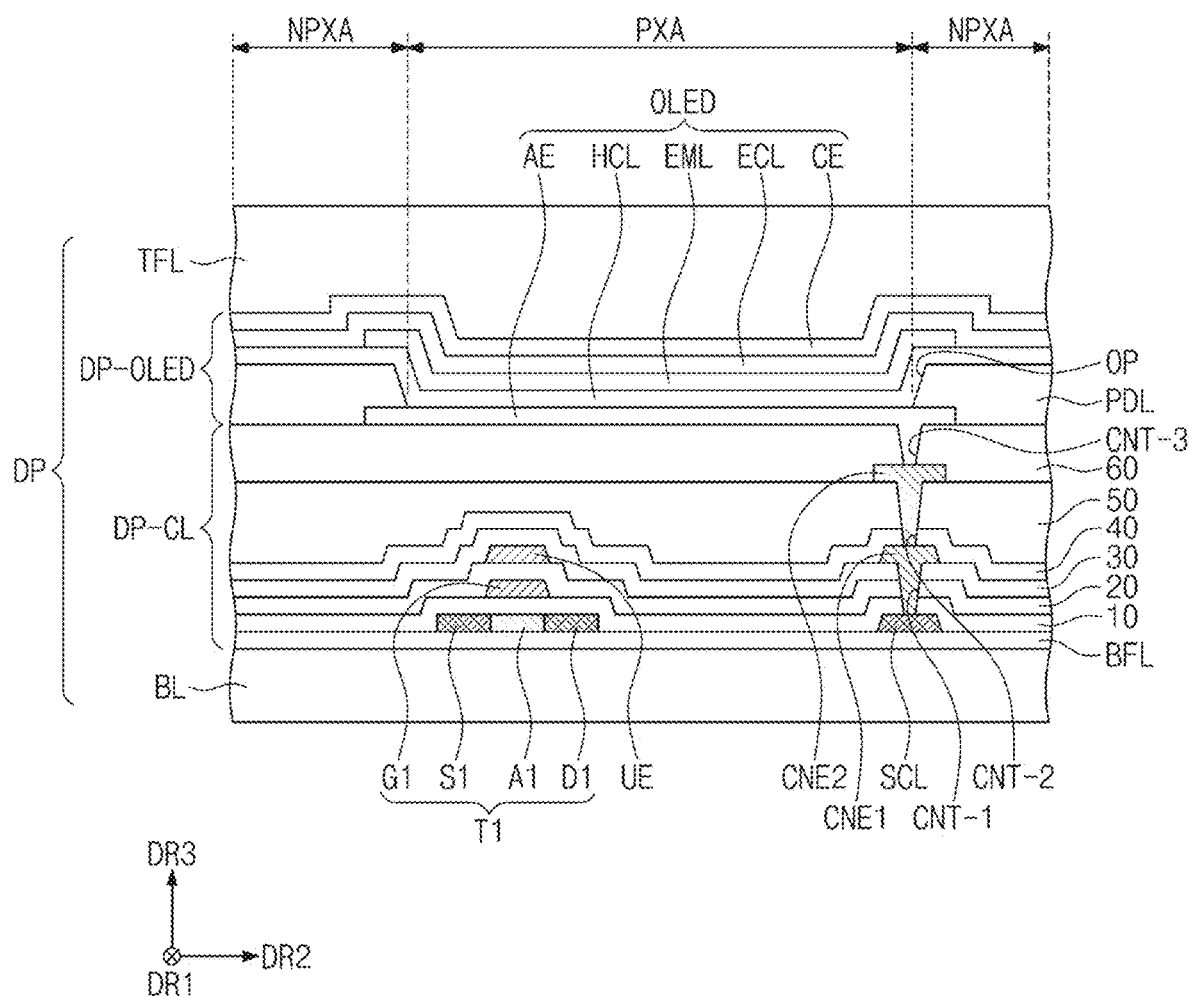
FIG. 3 is a cross-sectional view of a display device according to an embodiment of the invention.

FIG. 1 is a perspective view of a display device according to an embodiment of the invention. FIG. 2 is a cross-sectional view of a display device according to an embodiment of the invention. FIG. 3 is a cross-sectional view of a display device according to an embodiment of the invention.

Referring to FIGS. 1 and 2, an embodiment of the display device DD may be a device activated according to electrical signals. The display device DD may include various embodiments. In an embodiment, for example, the display device DD may include large-sized devices such as a smart television and an outdoor advertising board, and small and middle-sized devices such as a mobile phone, a tablet computer, a navigation device, and a game console. It would be understood that embodiments of the display device DD described herein are presented as an example, and thus the display device DD is not limited thereto as long as it does not depart from the teachings herein. FIG. 1 illustrates an embodiment where the display device DD is a smart phone as an example.

The display device DD may display an image IM, toward a third direction DR3, on a display surface FS parallel to each of a first direction DR1 and a second direction DR2. The image IM may include a still image as well as a dynamic image. FIG. 1 illustrates an embodiment where the image IM includes watch windows and icons as an example. The display surface FS on which the image IM is displayed may correspond to a front surface of the display device DD and may correspond to a front surface of a window panel WP.

The display surface FS may include a light-transmitting region TA on which the image IM is substantially provided to a user, and a bezel region BZA surrounding at least a portion of the light-transmitting region TA. The bezel region BZA may be defined by a bezel pattern disposed on the window WM. The light-transmitting region TA may display an image, and the bezel region BZA may not display an image.

In embodiments described herein, a front surface (or a top surface) and a rear surface (or a bottom surface) of respective components are defined with respect to a direction in which the image IM is displayed. The top and bottom surfaces may oppose each other in the third direction DR3 and the normal direction of each of the top and bottom surfaces may be parallel to the third direction DR3. Here, the directions indicated by the first to third directions DR1, DR2 and DR3 may be a relative concept and thus converted to other directions. In the specification, "on a plane" may be defined as viewed from the third direction DR3.

FIG. 2 schematically illustrates a stacked relationship between a functional panel and/or functional units constituting the display device DD.

The display device DD according to an embodiment may include a display panel DP, a sensor ISL, a light control layer PPL, an anti-reflection layer, and a window WM. In an alternative embodiment of the invention, the sensor ISL may be omitted.

According to an embodiment, at least some components among the display panel DP, the sensor ISL, the light control layer PPL, the anti-reflection layer, and the window WM may be formed by a continuous process. In such an embodiment, an adhesive layer may not be disposed between the components formed by the continuous process. The embodiment of the invention is not limited thereto, and at least some components among the display panel DP, the sensor ISL, the light control layer PPL, the anti-reflection layer, and the window WM may be coupled to each other through an adhesive layer. According to an embodiment, the adhesive layer disposed between the components may be a transparent adhesive layer including at least one selected from a pressure sensitive adhesive film (PSA), an optically clear adhesive film (OCA), and an optically clear resin (OCR).

The display panel DP generates an image. The display panel DP includes a plurality of pixels. Each of the plurality of pixels includes a driving circuit that controls a light emitting element and an operation of the light emitting element. The driving circuit may include at least one transistor and capacitor.

The display panel DP according to an embodiment of the invention may be a light emitting display panel including a light emitting element, and a type of the display panel is not particularly limited. In an embodiment, for example, the display panel DP may be an organic light emitting display panel or an inorganic light emitting display panel. An emission layer of the organic light emitting display panel may include an organic light emitting material. An emission layer of the inorganic light emitting display panel may include a quantum dot, a quantum rod, or an inorganic LED. Hereinafter, for convenience of description, embodiments where the display panel DP is the organic light emitting display panel will be described in detail.

The sensor ISL is disposed on the display panel DP. The sensor ISL acquires coordinate information of an external input (e.g., a touch event) The sensor ISL may detect the external input by an electrostatic capacitive method. In an embodiment, the sensor ISL may be directly disposed on the display panel DP. In such an embodiment, the sensor ISL may be formed through the continuous process on the display panel DP. The sensor ISL according to an embodiment may include at least one sensing insulation layer and sensing electrodes insulated from each other.

The light control layer PPL may control a path of light generated in the display panel DP. The light control layer PPL may collect light provided from the . . . display panel DP or may further diffuse light generated in some regions of the display panel DP. The light control layer PPL will be described later in greater detail.

The anti-reflection layer RPL may be disposed on the light control layer PPL. The anti-reflection layer RPL may be formed directly on the light control layer PPL or may be coupled to the light control layer PPL via the adhesive layer. The anti-reflection layer RPL may be defined as an external light anti-reflection film. The anti-reflection layer RPL may decrease the reflectivity of the external light incident to the display panel DP from the outside.

When the external light incident to the display panel DP is reflected by the display panel DP and re-provided to an external user, the user may recognize the reflected light. In an embodiment, the anti-reflection layer RPL may include a plurality of color filters having the same colors as the pixels of the display panel DP, respectively, to prevent the above-described phenomenon. The color filters may filter the external light to display the same colors as the pixels. In this case, the external light may not be recognized by the user.

However, the embodiment of the invention is not limited thereto, and alternatively, the anti-reflection layer RPL may include a polarizing film for reducing the reflectivity of the external light. The polarizing film may include a phase retarder and/or a polarizer.

The window WP according to an embodiment of the invention may include a base layer and a bezel pattern disposed below the base layer. The base layer may have a multilayer structure. The base layer may include an organic substrate or a synthetic resin film. The bezel pattern partially overlaps the base layer. The bezel pattern may define the bezel region BZA of the display device DD. According to an embodiment, the window WP may further include at least one functional layer coated on the base layer. The at least one functional layer may include at least one selected from an anti-reflection layer, a hard coating layer, and an impact absorbing layer.

The window WP according to an embodiment may be flexible. Accordingly, the base layer may include an ultra thin glass (UTG) or a colorless polyimide (CPI) film.

Referring to FIG. 3, an embodiment of the display panel DP may include a light emitting region PXA and a non-light emitting region NPXA. The light emitting region PXA and non-light emitting region NPXA may overlap or be included in the light-transmitting region TA (see FIG. 1) of the display device DD (see FIG. 1).

The display panel DP may include a base layer BL, a circuit element layer DP-CL, a display element layer DP-OLED, and an upper insulation layer TFL. The stacking structure of the display panel DP is not particularly limited.

In an embodiment, the display panel DP may include a plurality of insulation layers, a semiconductor pattern, a conductive pattern, signal lines, and the like. In an embodiment, the insulation layers, the semiconductor layer, and the conductive layer are formed through a method such as coating or deposition, and the insulation layers, the semiconductor layer, and the conductive layer may be selectively patterned by photolithography and etching. The semiconductor pattern, the conductive pattern, and the signal line, which are provided in the circuit element layer DP-CL and the display element layer DP-OLED, may be formed in the above-described manner.

The base layer BL may include a synthetic resin film. Alternatively, the base layer BL may include a glass substrate, a metal substrate, or an organic/inorganic composite material substrate, or the like. At least one inorganic layer is disposed on the upper surface of the base layer BL. The at least one inorganic layer may include a buffer layer BFL. The buffer layer BFL improves the coupling power between the base layer BL and the semiconductor pattern. The buffer layer BFL may include a silicon oxide layer and a silicon nitride layer. The silicon oxide layer and the silicon nitride layer may be alternately stacked with each other.

A semiconductor pattern is disposed on the buffer layer BFL. The semiconductor pattern may include polysilicon. However, the embodiment of the invention is not limited thereto, and alternatively the semiconductor pattern may also include amorphous silicon or a metal oxide.

FIG. 3 illustrates a portion of the semiconductor pattern. In an embodiment, for example, at least one semiconductor pattern may be further disposed in the light emitting region PXA. The semiconductor patterns may be arranged in a specific rule. The electrical properties of each of the semiconductor patterns are different according to whether being doped. Each of the semiconductor patterns may include a first region having a higher doping concentration and a second region having a lower doping concentration. The first region may be doped with an N-type dopant or a P-type dopant. A P-type transistor includes a first region into which the P-type dopant is doped.

The first region has conductivity greater than that of the second region and substantially serves as an electrode or a signal line. The second region substantially corresponds to an active (or channel) of the transistor. In other words, a portion of the semiconductor patterns may be the active of the transistor, and another portion may be a source or drain of the transistor, and still another portion may be a conductive region.

As illustrated in FIG. 3, a source S1, an active A1, a drain D1 of a transistor T1 are formed from (or defined by) semiconductor patterns. FIG. 3 illustrates a portion of a signal transfer region SCL formed from the semiconductor pattern. Although not separately illustrated, the signal transfer region SCL may be connected to the drain D1 of the transistor T1 on a plane.

A first insulation layer 10 to a sixth insulation layer 60 are disposed on the buffer layer BFL. Each of the first insulation layer 10 to the sixth insulation layer 60 may be an inorganic layer or an organic layer. A gate G1 is disposed on the first insulation layer 10. An upper electrode UE may be disposed on the second insulation layer 20. A first connection electrode CNE1 may be disposed on the third insulation layer 30. The first connection electrode CNE1 may be connected to the signal transfer region SCL through a contact hole CNT-1 defined through the first to third insulation layers 10 to 30. A second connection electrode CNE2 may be disposed on the fifth insulation layer 50. The second connection electrode CNE2 may be connected to the first connection electrode CEN1 through a contact hole CNT-2 defined through the fourth insulation layer 40 and the fifth insulation layer 50.

A light emitting element OLED is disposed on the sixth insulation layer 60. A first electrode AE is disposed on the sixth insulation layer 60. The first electrode AE is connected to the second connection electrode CNE2 through a contact hole CNT-3 defined through the sixth insulation layer 60. An opening OP is defined in a pixel defining film PDL. The opening OP may expose at least a portion of the first electrode AE. One light emitting region PXA may be defined in correspondence to the first electrode AE exposed by the corresponding opening OP. The non-light emitting region NPXA may be adjacent to the light emitting region PXA. The light emitting region PXA may overlap the pixel defining film PDL.

The hole control layer HCL may be disposed on the light emitting region PXA and the non-light emitting region NPXA in common. The hole control layer HCL may include a hole transport layer and further include a hole injection layer. An emission layer EML is disposed on the hole control layer HCL. The emission layer EML may be disposed in a region corresponding to the opening OP. The emission layer EML according to an embodiment may be disposed by being patterned in each of the plurality of light emitting regions. However, the embodiment of the invention is not limited thereto, and alternatively, the emission layer EML may be disposed in the plurality of light emitting regions in common.

An electron control layer ECL is disposed on the emission layer EML. The electron control layer ECL includes an electron transportation layer and may further include an electron injection layer. A second electrode CE is disposed on the electron control layer ECL.

The upper insulation layer TFL is disposed on the second electrode CE. The upper insulation layer TFL may include a plurality of thin films. In an embodiment, for example, the upper insulation layer TFL may include a first inorganic encapsulation layer IOL1, an organic encapsulation layer OL, and a second inorganic encapsulation layer IOL2 (shown in FIG. 4A). This three-layered structure may be defined as a thin-film encapsulation layer.

Figure 4A:
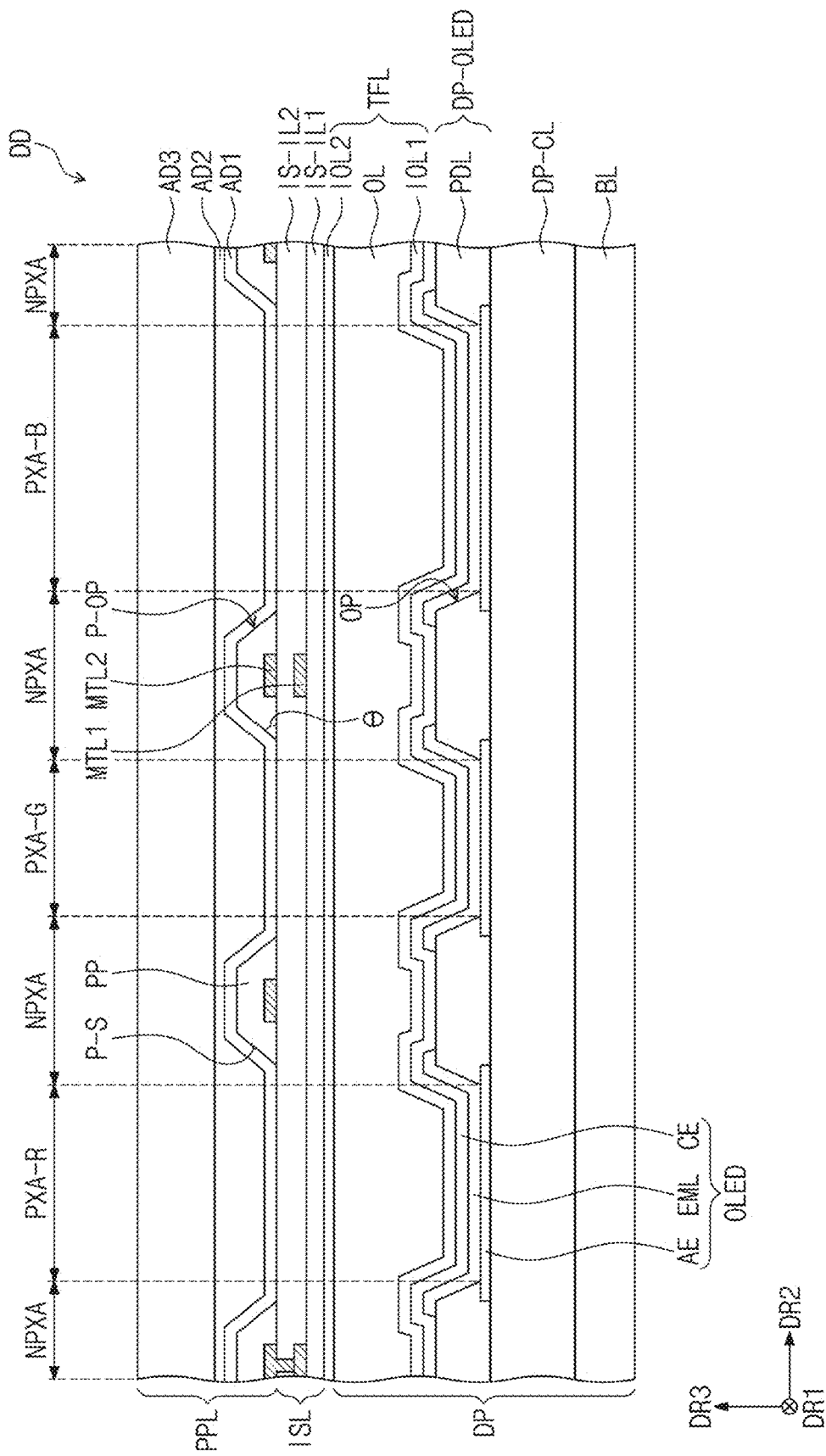
FIG. 4A is a cross-sectional view of a display device according to an embodiment of the invention.
Figure 4B:
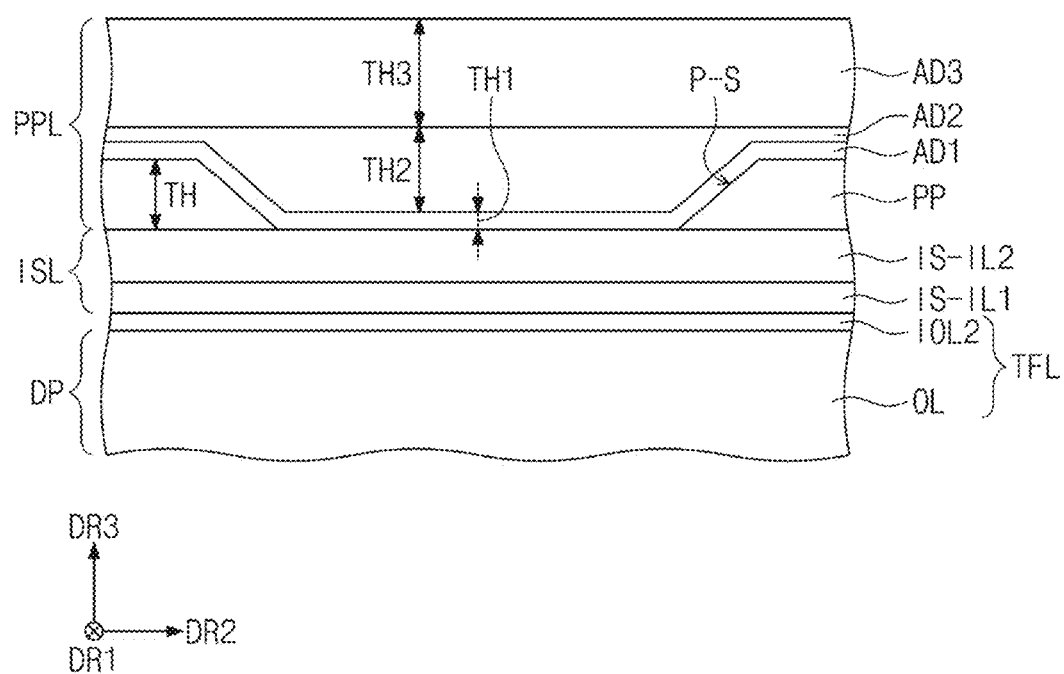
FIG. 4B is an enlarged cross-sectional view of the display device in one region of FIG. 4A.
Figure 5A:
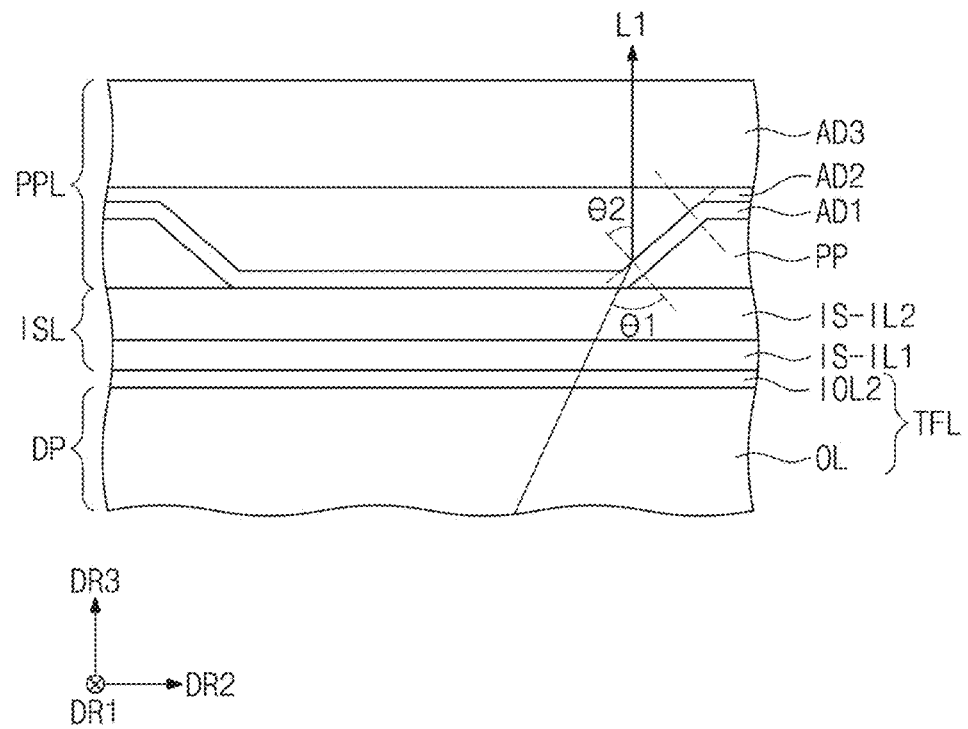
FIG. 5A is a cross-sectional view of a display device according to an embodiment of the invention.

FIG. 4A is a cross-sectional view of a display device according to an embodiment of the invention. FIG. 4B is an enlarged cross-sectional view of the display device in one region of FIG. 4A. FIG. 5A is a cross-sectional view of a display device according to an embodiment of the invention. FIG. 5A is a cross-sectional view of a display device according to an embodiment of the invention.

Referring to FIGS. 4A and 4B, the display device DD according to an embodiment may include a display panel DP, a sensor ISL, a light control layer PPL, an anti-reflection layer RPL, and a window WM. A base layer BL, a circuit element layer DP-CL, a display element layer DP-OLED, and an upper insulation layer TFL may correspond to the base layer BL, the circuit element layer DP-CL, the display element layer DP-OLED, and the upper insulation layer TFL as described above with reference to FIG. 3, and the transistor T1, the hole control layer HCL, and the electron control layer ECL as described above with reference to FIG. 3 are omitted for convenience of illustration and description.

FIG. 4A illustrates a cross-sectional view of the display device DD corresponding to the light emitting regions PXA-R, PXA-G, and PXA-B which provide different color light. The light emitting element OLED (see FIG. 3) may be disposed in each of the light emitting regions PXA-R, PXA-G, and PXA-B. The light emitting regions PXA-R, PXA-G, and PXA-B may be regions in which the different color light generated in the light emitting elements is provided. The light emitting regions PXA-R, PXA-G, and PXA-B may each be defined as the area of a first electrode AE exposed by the corresponding opening OP.

FIG. 4B is an enlarged cross-sectional view of one light emitting region PXA-R among the light emitting regions PXA-R, PXA-G, and PXA-B.

The display device DD according to an embodiment may include a sensor ISL disposed on the display panel DP. The sensor ISL may be directly disposed on the upper insulation layer TFL. In an embodiment, as shown in FIGS. 4A and 4B, the sensor ISL may include sensing insulation layers IS-IL1 and IS-IL2 and conductive patterns MTL1 and MTL2. Each of the sensing insulation layers IS-IL1 and IS-IL2 may include an inorganic material.

A first conductive pattern MTL1 may be disposed on the first sensing insulation layer IS-IL1, and be covered by the second sensing insulation layer IS-IL2. The second conductive pattern MTL2 may be disposed on the second sensing insulation layer IS-IL2. The second conductive pattern MTL2 may overlap the pixel defining film PDL. Thus, the second conductive pattern MTL2 may be spaced apart from the light emitting regions PXA-R, PXA-G, and PXA-B and may overlap the non-light emitting region NPXA.

A portion of the second conductive pattern MTL2 may be connected to the first conductive pattern MTL1 through the second sensing insulation layer IS-IL2.

According to an embodiment, the second conductive pattern MTL2 may include mesh lines overlapping the non-light emitting region NPXA. The mesh lines may extend in different oblique directions of the first and second directions DR1 and DR2, respectively, and a mesh opening corresponding to the opening OP defined in the pixel defining film PDL may be defined in the mesh lines.

The mesh lines may have a multilayered structure. In an embodiment, for example, the mesh lines may include first to third layers. The bonding force of a first layer with respect to the upper insulation layer TFL may be higher than that of a second layer. The conductivity of the second layer may be higher than that of the first and third layers. The reflectivity of the third layer with respect to the external light may be lower than that of the second layer. In an embodiment, for example, the first layer may include titanium, the second layer may include aluminum, and the third layer may include titanium.

However, the embodiment of the invention is not limited thereto, and the second conductive pattern MTL2 having the multilayered structure may include at least two of transparent conductive layers or metal layers. The second conductive pattern MTL2 having the multilayered structure may include metal layers including different metals from each other. The transparent conductive layers may include at least one selected from indium tin oxide (ITO), indium zinc oxide (IZO), zinc oxide (ZnO), indium tin zinc oxide (ITZO), PEDOT, a metal nanowire, and graphene. The metal layer may include at least one selected from molybdenum, silver, titanium, copper, aluminum, and an alloy thereof.

The light control layer PPL may be disposed on the sensor ISL. The light control layer PPL may include an organic pattern PP, a first adhesive layer AD1, a second adhesive layer AD2, and a third adhesive layer AD3.

The organic pattern PP may overlap the pixel defining film PDL. Thus, the organic pattern PP may be spaced apart from the light emitting regions PXA-R, PXA-G, and PXA-B and may overlap the non-light emitting region NPXA. The organic pattern PP may cover the second conductive pattern MTL2. That is, the organic pattern PP may be in contact with the second conductive pattern MTL2 overlapping the non-light emitting region NPXA and the second sensing insulation layer IS-IL2.

A pattern opening P-OP may be defined in the organic pattern PP. The pattern opening P-OP may correspond to the opening OP defined in the pixel defining film PDL. Thus, the pattern openings may be disposed in a one-to-one correspondence with the light emitting regions PXA-R, PXA-G, and PXA-B. The area of the pattern opening P-OP according to an embodiment may be larger than the area of the opening OP.

The organic pattern PP may have a trapezoid shape. Accordingly, an angle θ between the inner side surface P-S of the organic pattern PP defining the patter opening P-OP and the bottom surface of the organic pattern PP in contact with the second sensing insulation layer IS-IL2 may be an acute angle. In an embodiment, the angle θ between the inner side surface P-S and the bottom surface may be in a range of about 45° to about 80°.

The organic pattern PP may include an acrylate-based resin, an epoxide-based resin, a siloxane-based resin, a polyimide-based resin, or a mixture thereof. The organic pattern PP may include hollow silica particles.

In an embodiment, the refractive index of the organic pattern PP may be in a range of about 1.50 to about 1.54. Referring to FIG. 4B, the maximum thickness TH of the organic pattern PP may be in a range of about 2.0 micrometers (μm) to about 3.5 μm.

The first adhesive layer AD1 may be disposed on the organic pattern PP. The first adhesive layer AD1 may cover the second sensing insulating layer IS-IL2 and the organic pattern PP exposed by the pattern opening P-OP. The refractive index of the first adhesive layer AD1 according to an embodiment may be lower than the refractive index of the organic pattern PP.

In an embodiment, the refractive index of the first adhesive layer AD1 may be in a range of about 1.45 to about 1.48. Referring to FIG. 4B, the thickness TH1 of the first adhesive layer AD1 (hereinafter, will be referred to as "first thickness") may be in a range of about 1.0 μm to about 5.0 μm.

The first adhesive layer AD1 may be a transparent adhesive layer including at least one selected from a PSA, an OCA, and an OCR.

The second adhesive layer AD2 may be disposed on the first adhesive layer AD1. The second adhesive layer AD2 may provide a flat surface to a component disposed on the second adhesive layer AD2. The second adhesive layer AD2 may be a transparent adhesive layer including at least one selected from a PSA, an OCA, and an OCR.

The refractive index of the second adhesive layer AD2 may be lower than the refractive index of the first adhesive layer AD1. In an embodiment, the refractive index of the second adhesive layer AD2 may be in a range of about 1.55 to about 1.70. Referring to FIG. 4B, the thickness TH2 of the second adhesive layer AD2 (hereinafter, will be referred to as "second thickness") may be in a range of about 3.0 μm to about 25.0 μm.

In an embodiment, where the second adhesive layer AD2 includes the pressure sensitive adhesive film (PSA) and the second thickness TH2 may be in a range of about 10.0 μm to about 25.0 μm. In an embodiment, where the second adhesive layer AD2 includes the optically clear resin (OCR), the second thickness TH2 may be in a range of about 3.0 μm to about 20.0 μm.

The second adhesive layer AD2 may be an adhesive layer including a high refractive material. In an embodiment, for example, the second adhesive layer AD2 may include a base layer including an acrylic-based monomer and a high refractive material contained in the base layer. The high refractive material may include at least one selected from zirconium oxide, titanium oxide, and zinc oxide.

The base layer may include an acrylic-based monomer. In an embodiment, for example, the acrylic-based monomer contained in the base layer may include at least one selected from the following materials.

TABLE 1

| Chemical Name | Structure | Viscosity (at 25° C.) | Mw (Molecular weight) | Specific Gravity | Refractive Index (at 25° C.) |
| --- | --- | --- | --- | --- | --- |
| 1-Ethoxylated phenol acrylate | | 20 cps | 191 | 1.10 | 1.516 |
| 2-Ethoxylated phenol acrylate | | 30 cps | 226 | 1.11 | 1.510 |
| Bisphenol A ethoxylated acrylate | | 1000 cps | 516 | 1.13 | 1.5137 |
| Bisphenol A ethoxylated acrylate | | 700 cps | 773 | 1.12 | 1.516 |
| Phenoxy benzyl acrylate | | 20 cps | 254 | 1.12 | 1.565 |
| 1-Ethoxylated-ortho-phenol acrylate | | 130 cps | 268 | 1.13 | 1.577 |
| Pheyl-thioethyl acrylate | | 15 cps | 208 | 1.11 | 1.560 |
| Benzyl acrylate | | 5 cps | 162 | 1.06 | 1.540 |

The third adhesive layer AD3 may be disposed on the second adhesive layer AD2. The third adhesive layer AD3 may be a transparent adhesive layer including at least one selected from a PSA, an OCA, and an OCR. The refractive index of the third adhesive layer AD3 according to an embodiment may be lower than the refractive index of the second adhesive layer AD2. In an embodiment, the refractive index of the third adhesive layer AD3 may be in a range of about 1.45 to about 1.48.

Referring to FIG. 4B, in an embodiment where the display device DD has a flat shape illustrated in FIG. 1, that is, where the display panel DP (see FIG. 2) is rigid, the third thickness of the third adhesive layer AD3 may be in a range of about 25.0 µm to about 200.0 µm. The anti-reflection layer RPL described in FIG. 2 may be disposed on the third adhesive layer AD3.

The third thickness TH3 of the third adhesive layer D3 may vary with the shape of the display device. In an embodiment, for example, where the display DD-A (see FIGS. 7A and 7B), which will be described later, is the foldable display device DD-A, that is, where the display panel DP (see FIG. 2) is flexible, the third thickness TH3 of the third adhesive layer AD3 may be smaller than the third thickness TH3 of the third adhesive layer AD3 in a case where the display panel DP is the rigid display panel (see FIG. 2).

The first to third adhesive layers AD1, AD2, and AD3 may be formed by at least one selected from a lamination process and a coating process. In an embodiment, for example, the first to third adhesive layers AD1, AD2, and AD3 may be attached onto the sensor ISL by sequentially performing the lamination process. In an embodiment, after the first and second adhesive layers AD1 and AD2 are attached by the lamination process, the third adhesive layer AD3 may be formed by the coating process, and after the first adhesive layer AD1 is formed on the sensor ISL by the coating process, the second and third adhesive layers AD2 and AD3 may be attached on the first adhesive layer AD1 by the lamination process. The edge of the adhesive layer attached by the lamination process may be angulated, whereas the edge of the adhesive layer formed by the coating process may have a relatively rounded shape.

Hereinafter, physical properties of the adhesive layers AD1, AD2, and AD3 included in the light control layer PPL of the flat display device DD are described in Table 2.

The modulus of each of the first to third adhesive layers AD1, AD2, and AD3 may be in a range of about 20 kilopascals (Kpa) to about 50 Kpa at a room temperature (e.g., 25° C.).

"Creep %" and "recovery %" in Table 2 are obtained by measuring the deformation state of each of the first to third adhesive layers AD1, AD2, and AD3 in a state in which an axial force is set to 1.0 newton (N), a sensitivity is set to 0.1 N, a torque is set to 2000 pa, a temperature is set to 60° C., a creep time is set to 600 seconds (sec), and a recovery time is set to 600 sec in rheometer equipment (DHR-G2 from TA instruments).

The creep % represents a strain rate of each of the first to third adhesive layers AD1, AD2, and AD3 after 600 sec, which is a creep time, and the recovery % represents the ratio of the strain rate at 600 sec, which is a creep time, to a residual strain rate in a state in which 600 sec, which is a recovery time, has passed.

The creep % and the recovery % of the adhesive layers AD1, AD2, and AD3 included in the light control layer PPL of the flat display device DD may be the same as each other.

In Comparative Example, an organic layer including a single layer or multiple layers including an organic polymer material may be disposed on the organic pattern PP. The organic polymer material may include an acrylic-based or siloxane-based organic material. In Comparative Example, for example, the organic layer may include at least one selected from methyltrimethoxysilane, tetramethoxysilane, and polydiarylsiloxane. The organic layer according to Comparative Example may be a component for improving the light output efficiency of the display device.

The modulus of the organic layer in Comparative Example may be in a range of about 2 megapascals (Mpa) to about 3 Mpa at a room temperature (25° C.). Accordingly, the organic layer disposed to improve the light output efficiency in Comparative Example may have a modulus relatively greater than those of the first to third adhesive layers AD1, AD2, and AD3 according to embodiments of the invention.

When a local stress is applied to the display device DD, a component having a large modulus has a low deformation rate with respect to an impact, and accordingly, the impact may not be absorbed and transmitted to the components disposed below the component having the large modulus.

TABLE 2

| Element | Tg (glass transition temperature) | Modulus(MPa) | | | Creep % | Recovery % |
|---|---|---|---|---|---|---|
| | | −20° C. | 25° C. | 60° C. | 60° C. | 60° C. |
| AD3 | <5° C. | >250 | 0.020 to 0.050 | 0.010 to 0.050 | 50 to 100 | >80% |
| AD2 | <25° C. | >250 | 0.020 to 0.050 | 0.010 to 0.050 | 50 to 100 | >80% |
| AD1 | <5° C. | >250 | 0.020 to 0.050 | 0.010 to 0.050 | 50 to 100 | >80% |

In Table 2, AD1 may correspond to the first adhesive layer AD1, AD2 may correspond to the second adhesive layer AD2, and AD3 may correspond to the third adhesive layer AD3.

Among the first to third adhesive layers AD1, AD2, and AD3, the glass transition temperature (Tg) of the second adhesive layer AD2 may be the highest. Accordingly, the strength of the second adhesive layer AD2 may be greater than those of the first and third adhesive layers AD1 and AD3 at room temperature.

In embodiments of the invention, the first to third adhesive layers AD1, AD2, and AD3 have a relatively smaller modulus than that of the organic layer according to Comparative Example, and thus have a high absorption rate against an external impact. Accordingly, the display device DD with improved impact resistance may be provided.

The light output efficiency according to the light path passing through the light control layer PPL will be described with reference to FIGS. 5A and 5B.

Figure 5B:
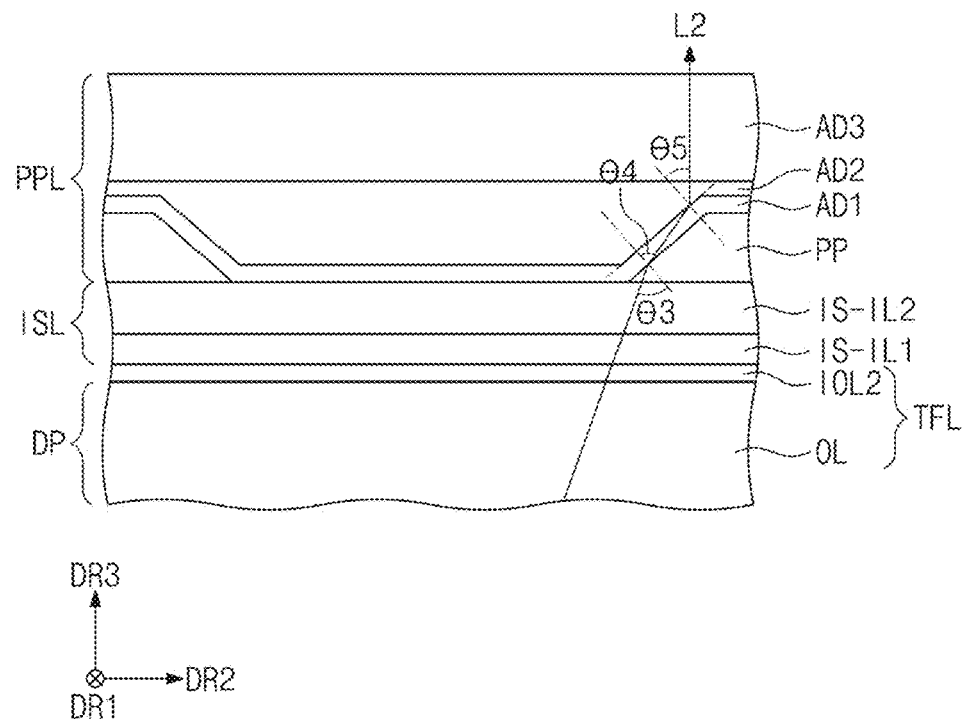
FIG. 5B is a cross-sectional view of a display device according to an embodiment of the invention.

FIG. 5A is an embodiment in which first light L1 generated in the light emitting element OLED (see FIG. 3) is not provided to the organic pattern PP but passes through the first to third adhesive layers AD1, AD2, and AD3, and FIG. 5B is an embodiment in which second light L2 generated in the light emitting element OLED (see FIG. 3) is provided to the organic pattern PP and then passes through the first to third adhesive layers AD1, AD2, and AD3.

The light control layer PPL according to an embodiment may include the organic pattern PP having a refractive index in a range of about 1.50 to about 1.54, the first adhesive layer AD1 having a refractive index in a range of about 1.45 to about 1.48 lower than that of the organic pattern PP, the second adhesive layer AD2 having a refractive index in a range of about 1.55 to about 1.70 higher than that of the first adhesive layer AD1, and the third adhesive layer AD3 having a refractive index in a range of about 1.45 to about 1.48 lower than that of the second adhesive layer AD2.

Referring to FIG. 5A, the first light L1 may be provided to the first adhesive layer AD1 at a first angle θ1, may be refracted at the interface between the first adhesive layer AD1 and the second adhesive layer AD2, and may pass through the second and third adhesive layers AD2 and AD3 at a second angle θ2. The first angle θ1 and the second angle θ2 may be defined as angles with respect to a normal line of the interface. In an embodiment, the first angle θ1 may be larger than the second angle θ2. The light path of the first light L1 may be changed by a refractive index difference between the first to third adhesive layers AD1, AD2, and AD3.

The light provided in the oblique direction from the light emitting element OLED (see FIG. 3) may pass through the first to third adhesive layers AD1, AD2, and AD3 to be provided to the light-transmitting region TA (see FIG. 1).

Referring to FIG. 5B, the second light L2 may be provided to the organic pattern PP at a third angle θ3, and the second light L2 may be refracted at the interface between the organic pattern PP and the first adhesive layer AD1 to pass through the first adhesive layer AD1 at a fourth angle θ4.

The second light L2 may be provided to the second adhesive layer AD2 at the fourth angle θ4, may be refracted at the interface between the first adhesive layer AD1 and the second adhesive layer AD2, and may pass through the second adhesive layer AD2 at a fifth angle θ5. The third angle θ3, the fourth angle θ4, and the fifth angle θ5 may be defined as angles with respect to a normal line of the corresponding interface. In an embodiment, the third angle θ3 may be smaller than the fourth angle θ4, and the fourth angle θ4 may be larger than the fifth angle θ5. The light path of the second light L2 may be changed by a refractive index difference between the organic pattern PP and the first to third adhesive layers AD1, AD2, and AD3.

The light provided from the light emitting element OLED (see FIG. 3) to the organic pattern PP may pass through the organic pattern PP and the first to third adhesive layers AD1, AD2, and AD3 to be provided to the light-transmitting region TA (see FIG. 1). Therefore, the diffuse light provided to the organic pattern PP may be collected.

According to an embodiment, the light control layer PPL may change a path of the light provided to the organic pattern PP as well as the light provided in the oblique direction among light generated in the light emitting element OLED (see FIG. 3). Accordingly, the display device DD (see FIG. 1) with improved light output efficiency may be provided. In such an embodiment, as described above, the light control layer PPL may have improved impact resistance, and thus the display device DD (see FIG. 1) having improved display quality and durability may be provided.

Figure 6A:
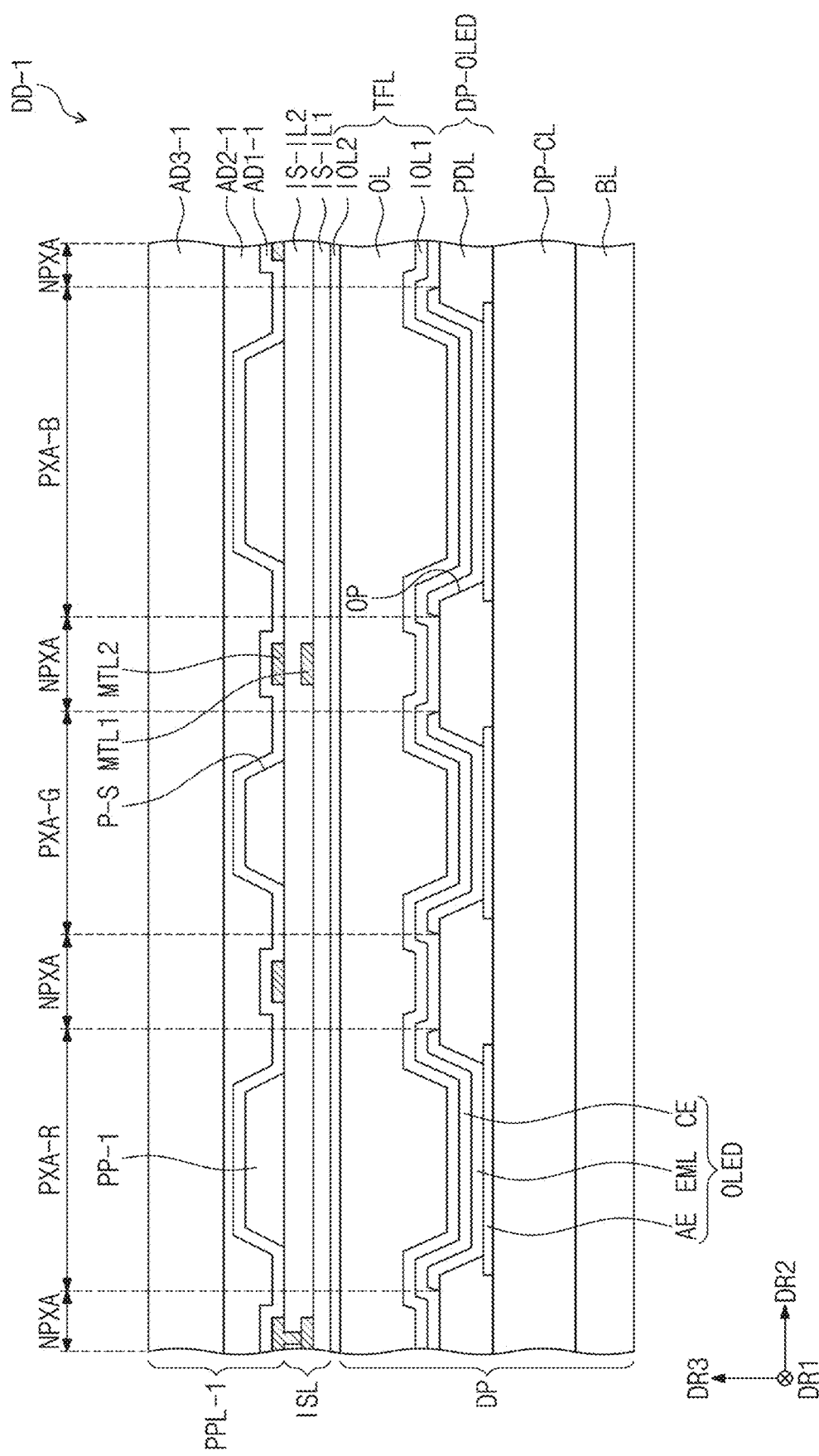
FIG. 6A is a cross-sectional view of a display device according to an alternative embodiment of the invention.
Figure 6B:
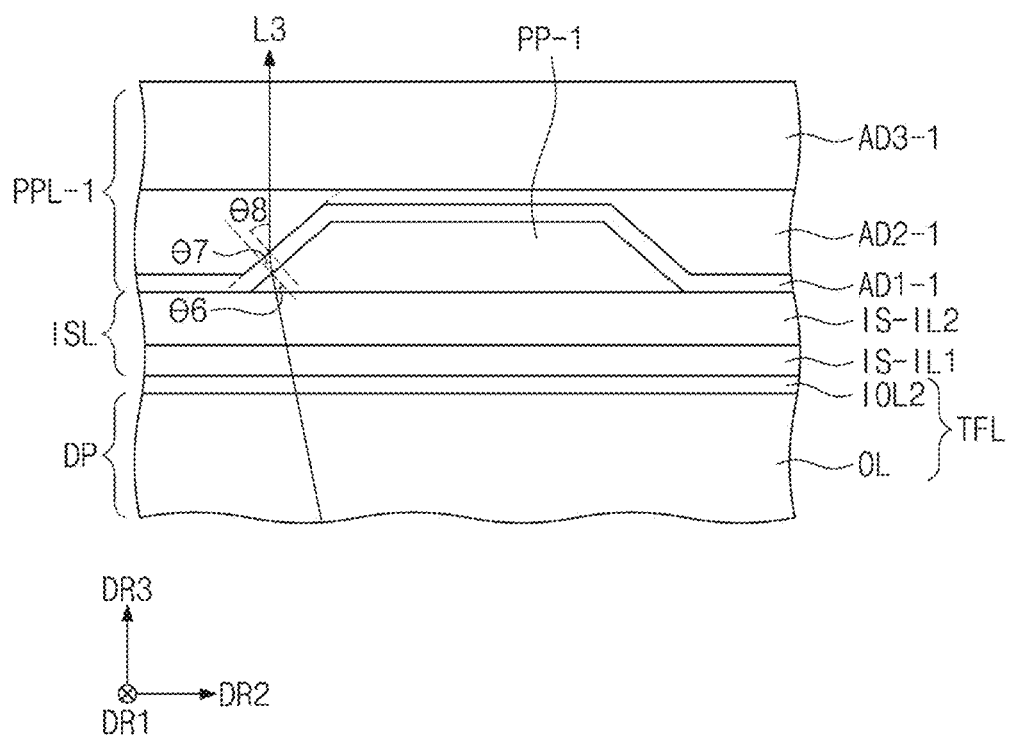
FIG. 6B is an enlarged cross-sectional view of the display device in one region of FIG. 6A.

FIG. 6A is a cross-sectional view of a display device according to an alternative embodiment of the invention. FIG. 6B is an enlarged cross-sectional view of the display device in one region of FIG. 6A. The same/like reference numerals are given for the same/like components as described above with reference to FIGS. 1 to 5B, and any repetitive detailed descriptions thereof will be omitted or simplified.

Referring to FIG. 6A, the display device DD-1 according to an embodiment may include a display panel DP, a sensor ISL, and a light control layer PPL-1. The anti-reflection layer RPL and window WM as described in FIG. 2 are omitted.

The light control layer PPL-1 may control a path of light generated in the display panel DP. The light control layer PPL-1 may collect the light provided in the display panel DP. The light control layer PPL-1 may further diffuse light generated in some regions of the display panel DP.

The light control layer PPL-1 may be disposed on the sensor ISL. The light control layer PPL-1 may include organic patterns PP-1, a first adhesive layer AD1-1, a second adhesive layer AD2-1, and a third adhesive layer AD3-1.

Each of the organic patterns PP-1 may be disposed on the sensor ISL. The organic patterns PP-1 may be spaced apart from each other and may one-to-one correspond to the light emitting regions PXA-R, PXA-G, and PXA-B. Each of the organic patterns PP-1 may be in a floating state on the sensor ISL. In such an embodiment, the organic patterns PP-1 may not overlap a second conductive pattern MTL2.

Each of the organic patterns PP-1 may have a trapezoid shape on a cross-section. Accordingly, an angle between the side surface P-S of each of the organic patterns PP-1 and the bottom surface of each of the organic patterns PP-1 in contact with the second sensing insulation layer IS-IL2 may be an acute angle.

The area of each of the organic patterns PP-1 may be different from each other. The area of the organic patterns PP-1 may be proportional to the area ratio of the corresponding light emitting regions PXA-R, PXA-G, and PXA-B.

Each of the organic patterns PP-1 may include an acrylate-based resin, an epoxide-based resin, a siloxane-based resin, a polyimide-based resin, or a mixture thereof.

The first adhesive layer AD1-1 may be disposed on the organic patterns PP-1. The first adhesive layer AD1-1 may cover the second sensing insulation layer IS-IL2 exposed by the organic patterns PP-1, the organic patterns PP-1, and the second conductive pattern MTL2. The refractive index of the first adhesive layer AD1-1 according to an embodiment may be larger than those of the organic patterns PP-1.

The first adhesive layer AD1-1 may be a transparent adhesive layer including at least one selected from a PSA, an OCA, and an OCR.

The second adhesive layer AD2-1 may be disposed on the first adhesive layer AD1-1. The second adhesive layer AD2-1 may provide a flat surface to a component disposed on the second adhesive layer AD2-1. The second adhesive layer AD2-1 may be a transparent adhesive layer including at least one selected from a PSA, an OCA, and an OCR. The refractive index of the second adhesive layer AD2-1 may be lower than the refractive index of the first adhesive layer AD1-1.

The third adhesive layer AD3-1 may be disposed on the second adhesive layer AD2-1. The third adhesive layer AD3-1 may be a transparent adhesive layer including at least one selected from a PSA, an OCA, and an OCR. The refractive index of the third adhesive layer AD3-1 according to an embodiment may be larger than that of the second adhesive layer AD2-1.

The light output efficiency according to the light path passing through the light control layer PPL-1 will be described with reference to FIG. 6B.

FIG. 6B is an embodiment in which the third light L3 generated in the light emitting element OLED (see FIG. 3) is provided to one organic pattern PP-1 and then passes through the first to third adhesive layers AD1-1, AD2-1, and AD3-1.

Referring to FIG. 6B, the third light L3 may be provided to the organic pattern PP-1 at a sixth angle θ6, may be refracted at the interface between the organic pattern PP-1 and the first adhesive layer AD1-1 to pass through the second adhesive layer AD2-1 at a seventh angle θ7, and the third light L3 may be refracted at the interface between the first adhesive layer AD1-1 and the second adhesive layer AD2-1 to pass through the second adhesive layer AD2 at an eighth angle θ8. The sixth angle θ6, the seventh angle θ7, and the eighth angle θ8 may be defined as angles with respect to a normal line of the corresponding interface. In an embodiment, the sixth angle θ6 may be larger than the seventh angle θ7, and the seventh angle θ7 may be smaller than the eighth angle θ8. The light path of the third light L3 may be changed by a refractive index difference between the organic pattern PP-1 and the first to third adhesive layers AD1-1, AD2-1, and AD3-1.

According to an embodiment, the light provided in the oblique direction from the light emitting element OLED (see FIG. 3) may pass through the first to third adhesive layers AD1-1, AD2-1, and AD3-1 to be provided to the light-transmitting region TA (see FIG. 1).

Figure 7A:
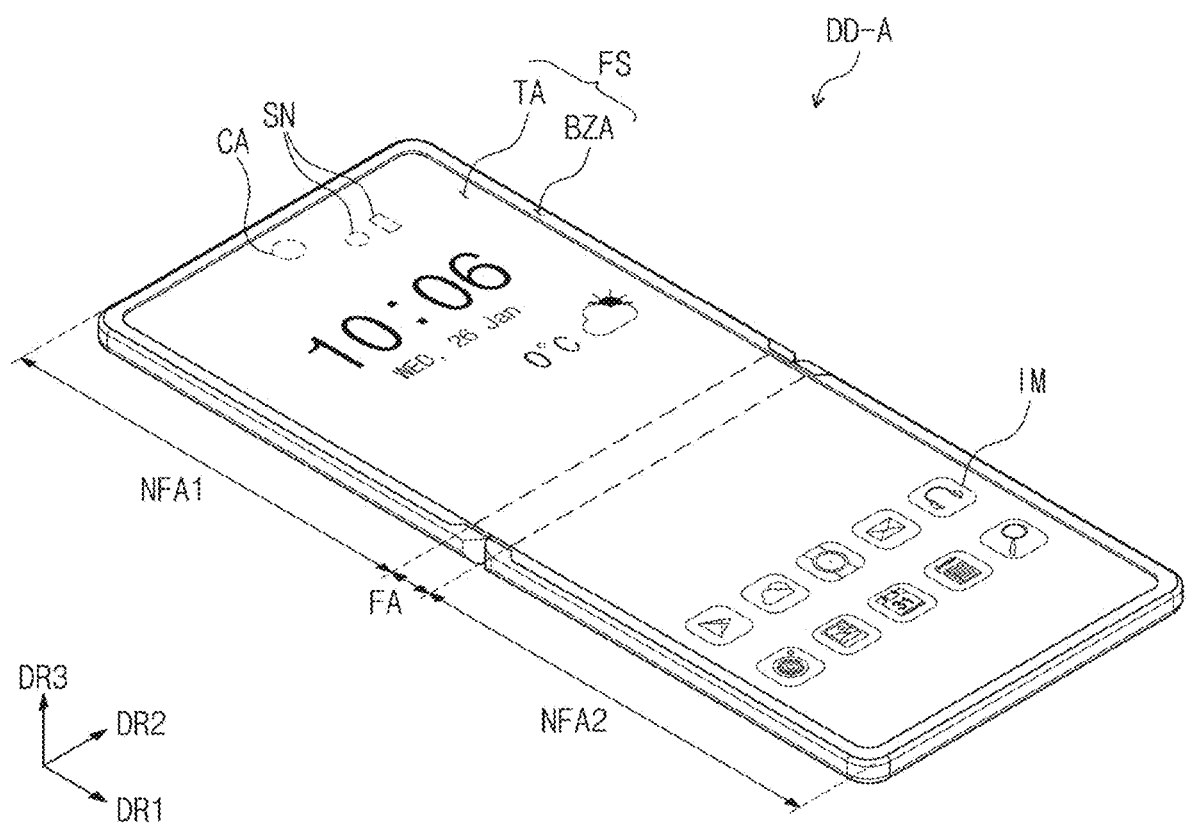
FIG. 7A is a perspective view of a display device in an unfolded state according to an embodiment of the invention.
Figure 7B:
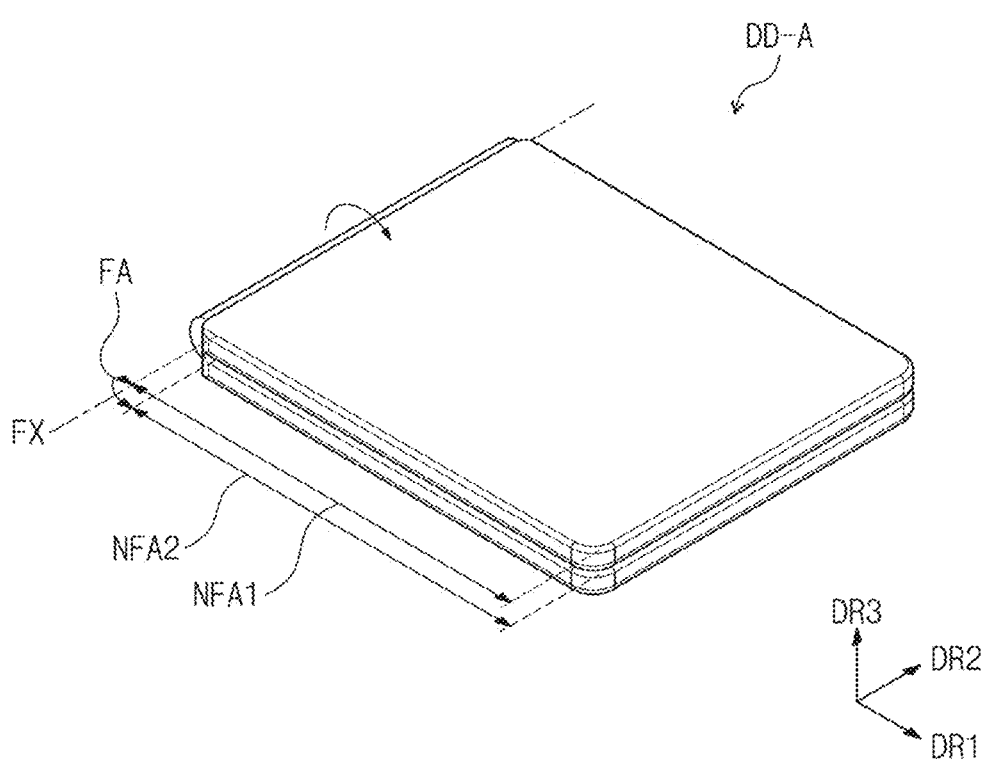
FIG. 7B is a perspective view of a display device in a folded state according to an embodiment of the invention.

FIG. 7A is a perspective view of a display device in an unfolded state according to an embodiment of the invention. FIG. 7B is a perspective view of a display device in a folded state according to an embodiment of the invention.

Referring to FIG. 7A, the display device DD-A according to an embodiment may include a folding region FA and a plurality of non-folding regions NFA1 and NFA2 adjacent to the folding region FA. The non-folding regions NFA1 and NFA2 may include a first non-folding region NFA1 and a second non-folding region NFA2 that are spaced apart from each other in the first direction DR1 with the folding region FA located therebetween.

FIG. 7A illustrates an embodiment where a single folding region FA and two non-folding regions NFA1 and NFA2 are defined, but the numbers of the folding region FA and the non-folding regions NFA1 and NFA2 are not limited thereto. The display device DD-A may include, for example, at least three non-folding regions and at least two folding regions disposed between the non-folding regions.

The display surface FS may include a light-transmitting region TA and a bezel region BZA surrounding at least a portion of the light-transmitting region TA. The light-transmitting region TA may display an image, and the bezel region BZA may not display an image.

The display device DD-A may include at least one sensor SN and at least one camera CA. In an embodiment, the sensor SN and camera CA may be disposed to overlap the light-transmitting region TA. In an embodiment, for example, the sensor SN and camera CA may be disposed in the light-transmitting region TA adjacent to the bezel region BZA. The sensor SN and camera CA may be disposed in the first non-light emitting region NFA1, but the embodiment of the invention is not limited thereto, and the sensor SN and camera CA may be disposed in the second non-light emitting region NFA2.

The light may pass through the light-transmitting region TA overlapping the sensor SN and the camera CA in the light-transmitting region TA of the display surface FS, and the passed light may be provided to the camera CA and the sensor SN. In an embodiment, for example, the sensor SN may be a proximity sensor, but the type of the sensor SN is not limited thereto. The camera CA may capture an external image. The sensor SN and the camera CA may be provided in plurality.

Referring to FIG. 7B, the display device DD-A according to an embodiment may be a foldable display device DD-A that is folded or unfolded. In an embodiment, for example, the folding region FA of the display device DD-A may be folded with respect to a folding axis FX extending in the second direction DR2. In an embodiment, the folding axis FX may be defined as a short axis parallel to the short side of the display device DD-A. The display device DD-A may be in-folded, but the embodiment of the invention is not limited thereto, and the display device DD-A may be out-folded.

When the display device DD-A is folded, the first non-folding region NFA1 and the second non-folding region NFA2 may face each other, and the display device DD-A may be in-folded so that the display surface FS is not exposed to the outside. However, the embodiment of the invention is not limited thereto. In an embodiment, for example, the display device DD-A may be out-folded so that the display surface FS is exposed to the outside with respect to the folding axis FX.

The cross-sectional view of the display device DD-A may correspond to that described through FIGS. 2 to 5B. In such an embodiment, the display device DD-A may include the display panel DP (see FIG. 4A), the sensor ISL (see FIG. 4A), and the light control layer PPL (see FIG. 4A).

The thickness of the adhesive layers included in the light control layer PPL of the foldable display device DD-A may be different from the thickness of the adhesive layers included in the light control layer PPL of the flat display device DD (see FIG. 1) in order to improve the foldable properties.

In an embodiment, for example, the thickness of the third adhesive layer AD3 (see FIG. 4B) included in the light control layer PPL of the flat display device DD may be in a range of about 25.0 μm to about 200.0 μm. In an embodiment, the thickness of the third adhesive layer AD3 (see FIG. 4B) included in the light control layer PPL of the foldable display device DD-A may be in a range of about 25.0 μm to about 75.0 μm.

The first and second adhesive layers AD1 and AD2 (see FIG. 4B) included in the light control layer PPL of the foldable display device DD-A may have the same thickness as the first and second adhesive layers AD1 and AD2 (see FIG. 4B) included in the light control layer PPL of the flat display device DD.

Hereinafter, physical properties of the adhesive layers included in the light control layer PPL of the foldable display device DD-A are shown in Table 3.

TABLE 3

| Element | Tg (glass transition temperature) | Modulus(MPa) −20° C. | 25° C. | 60° C. | Creep % 60° C. | Recovery % 60° C. |
|---|---|---|---|---|---|---|
| AD3 | <−35° C. | <0.15 | 0.020 to 0.050 | 0.010 to 0.050 | 10 to 50 | >90% |
| AD2 | <−10° C. | <50 | 0.020 to 0.1 | 0.010 to 0.050 | 10 to 50 | >80% |
| AD1 | <−10° C. | <50 | 0.020 to 0.1 | 0.010 to 0.050 | 10 to 50 | >80% |

In Table 3, AD1 may correspond to the first adhesive layer AD1 included in the light control layer PPL of the foldable display device DD-A, AD2 may correspond to the second adhesive layer AD2, and AD3 may correspond to the third adhesive layer AD3.

According to an embodiment, since the third adhesive layer AD3 has the lowest glass transition temperature (Tg), the third adhesive layer AD3 may be relatively flexible at room temperature as compared with the first and second adhesive layers AD1 and AD2.

The modulus of each of the first and second adhesive layers AD1 and AD2 may be in a range of about 20 Kpa to about 100 Kpa at a room temperature (25° C.). The modulus of the third adhesive layer AD3 may be about 20 Kpa to about 50 Kpa at room temperature (25° C.).

Creep % of the adhesive layers AD1, AD2, and AD3 included in the light control layer PPL of the foldable display device DD-A may be lower than creep % of the adhesive layers AD1, AD2, and AD3 included in the light control layer PPL of the flat display device DD. In addition, for recovery % of the third adhesive layer AD3 disposed in the uppermost part, the recovery % of the third adhesive layer AD3 included in the light control layer PPL of the foldable display device DD-A may be greater than that of the third adhesive layer AD3 included in the light control layer PPL of the flat display device DD. Accordingly, the third adhesive layer AD3 included in the light control layer PPL of the foldable display device DD-A may be easily restored even though the strain is increased by the folding operation or the external impact.

According to embodiments, the uppermost adhesive layer included in the light control layer PPL of the foldable display device DD-A has a relatively thin thickness, such that cracks in the folding region FA may be prevented from occurring, and the display device DD-A having improved foldable properties may be provided.

Embodiments of the display device according to the invention include the light control layer including the insulation layers having different refractive indices from each other, and thus may have an improvement in light output efficiency of the display panel. IN such embodiments, the light control layer has a low modulus, and thus the display device having improved impact resistance may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel including light emitting regions, in which light emitting elements are respectively disposed, and a non-light emitting region adjacent to the light emitting regions; and
a light control layer including:
an organic pattern in which pattern openings, which overlap the non-light emitting region and respectively correspond to the light emitting regions, are defined;
a first adhesive layer which covers the organic pattern and has a lower refractive index than the organic pattern;
a second adhesive layer which is disposed on the first adhesive layer and has a higher refractive index than the first adhesive layer; and
a third adhesive layer which is disposed on the second adhesive layer and has a lower refractive index than the second adhesive layer.

2. The display device of claim 1, wherein an inner side surface of the organic pattern defining each of the pattern openings is inclined.

3. The display device of claim 2, wherein an angle between a bottom surface of the organic pattern and the inner side surface of the organic pattern is in a range of about 45° to about 80°.

4. The display device of claim 1, wherein the organic pattern has a thickness in a range of about 2.0 μm to about 3.5 μm.

5. The display device of claim 1, wherein each of the first adhesive layer and the third adhesive layer has a refractive index in a range of about 1.45 to about 1.48.

6. The display device of claim 1, wherein the first adhesive layer has a thickness in a range of about 1 μm to about 5 μm.

7. The display device of claim 1, wherein the second adhesive layer has a refractive index in a range of about 1.55 to about 1.70.

8. The display device of claim 7, wherein
the second adhesive layer includes a base layer including an acrylic-based monomer and a high refraction material, and
the high refraction material includes at least one selected from zirconium oxide, titanium oxide, and zinc oxide.

9. The display device of claim 1, wherein the second adhesive layer has a maximum thickness of about 3 μm to about 25 μm.

10. The display device of claim 1, wherein the third adhesive layer has a thickness in a range of about 25 μm to about 200 μm.

11. The display device of claim 1, wherein the display panel and the light control layer is foldable with respect to a folding axis extending in one direction.

12. The display device of claim 1, further comprising:
a sensor disposed between the display panel and the light control layer,
wherein the sensor includes at least one insulation layer and sensing electrodes insulated from each other.

13. The display device of claim 12, wherein
the at least one insulation layer includes a first sensing insulation layer disposed on the display panel and a second sensing insulation layer disposed on the first sensing insulation layer, and
the organic pattern is disposed on the second sensing insulation layer.

14. The display device of claim 13, wherein
the sensing electrodes include a first conductive pattern disposed on the first sensing insulation layer and a second conductive pattern disposed on the second sensing insulation layer, and
the second conductive pattern includes mesh lines overlapping the non-light emitting region.

15. The display device of claim 14, wherein at least a portion of the mesh lines is in contact with the organic pattern.

16. The display device of claim 11, wherein each of the first adhesive layer, the second adhesive layer and the third adhesive layer has a modulus in a range of about 20 Kpa to about 100 Kpa.

17. A display device comprising:
a display panel including light emitting regions, a non-light emitting region adjacent to the light emitting regions, and pixels which provide light to the corresponding light emitting regions among the light emitting regions; and
a light control layer including:
organic patterns respectively corresponding to the light emitting region;
a first adhesive layer which covers the organic patterns and has a higher refractive index than the organic patterns;
a second adhesive layer which is disposed on the first adhesive layer and has a lower refractive index than the first adhesive layer; and
a third adhesive layer which is disposed on the second adhesive layer and has a higher refractive index than the second adhesive layer.

18. The display device of claim 17, wherein an angle between a bottom surface of the organic patterns and an inner side surface of the organic patterns is in a range of about 45° to about 80°.

19. The display device of claim 17, wherein each of the organic patterns has a thickness in a range of about 2.0 µm to about 3.5 µm.

20. The display device of claim 17, wherein
the first adhesive layer has a thickness in a range of about 1 µm to about 5 µm,
the second adhesive layer has a maximum thickness in a range of about 3 µm to about 25 µm, and
the third adhesive layer has a thickness in a range of about 25 µm to about 200 µm.

* * * * *